United States Patent [19]

Miyazaki

[11] Patent Number: 5,654,678
[45] Date of Patent: Aug. 5, 1997

[54] LEVEL-CONTROLLED OSCILLATION CIRCUIT HAVING A CONTINUOUSLY VARIABLE IMPEDANCE CONTROL CIRCUIT

[75] Inventor: Shinichi Miyazaki, Tokyo, Japan

[73] Assignee: NEC Corporation, Tokyo, Japan

[21] Appl. No.: 610,517

[22] Filed: Mar. 4, 1996

Related U.S. Application Data

[63] Continuation of Ser. No. 161,547, Dec. 6, 1993, abandoned.

[30] Foreign Application Priority Data

Dec. 7, 1992 [JP] Japan .................................. 4-326922

[51] Int. Cl.⁶ .................................................. H03B 5/32
[52] U.S. Cl. .................. 331/176; 331/66; 331/116 R; 331/36 C
[58] Field of Search ............................ 331/116 FE, 116 R, 331/158, 74, 183, 176, 175, 66, 36 C, 177 R; 332/125

[56] References Cited

U.S. PATENT DOCUMENTS

| | | |
|---|---|---|
| 3,560,880 | 2/1971 | Easton et al. .................. 331/175 |
| 4,193,046 | 3/1980 | Chiba .................................. 331/109 |
| 4,851,791 | 7/1989 | Marotel .............................. 331/158 |
| 5,101,178 | 3/1992 | Komoda ............................. 331/158 |

FOREIGN PATENT DOCUMENTS

| | | | |
|---|---|---|---|
| 2305056 | 10/1976 | France . | |
| 52-122451 | 10/1977 | Japan . | |
| 0143841 | 11/1980 | Japan .................................. | 331/183 |
| 0278201 | 12/1986 | Japan .................................. | 331/176 |

Primary Examiner—Robert Pascal
Assistant Examiner—Arnold Kinkead
Attorney, Agent, or Firm—Young & Thompson

[57] ABSTRACT

An oscillation circuit using a quartz oscillator. When the output level of the oscillation circuit falls, this output level change is detected and the reactance of the quartz oscillator is changed such that the circuit oscillates at a frequency which reduces the resistance of the oscillator. Hence, the oscillation of the circuit does not fall in level or stop regardless of temperature and other ambient conditions.

3 Claims, 4 Drawing Sheets

LEVEL-CONTROLLED OSCILLATION CIRCUIT HAVING A CONTINUOUSLY VARIABLE IMPEDANCE CONTROL CIRCUIT

This application is a continuation of application Ser. No. 08/161,547, filed Dec. 6, 1993, now abandoned.

BACKGROUND OF THE INVENTION

The present invention relates to an oscillation circuit applicable to various kinds of electronic apparatuses as a clock source and, more particularly, to an oscillation circuit of the type using a quartz oscillator and free from the accidental fall of oscillation level and the accidental stop of oscillation.

A conventional oscillation circuit, particularly one using a quartz oscillator, oscillates continuously only when the resistance Rx of the oscillator relative to the frequency and the negative resistance —Ro of the circuit satisfy a relation |−Ro|>|Rx|. The oscillation is stabilized when the oscillation level increases until |Rx|=|—Ro| holds.

However, the problem with the conventional circuit is that when the negative resistance —Ro of the circuit decreases due to, for example, a change in ambient temperature, the oscillation level also falls. Further, when the negative resistance —Ro of the circuit decreases to below the resistance Rx of the oscillator, the circuit practically stops oscillating.

SUMMARY OF THE INVENTION

It is, therefore, an object of the present invention to provide an oscillation circuit which does not fall in oscillation level or does not stop oscillating without regard to temperature and other ambient conditions.

An oscillation circuit of the present invention comprises a resonance circuit including a quartz oscillator, an active circuit for driving the quartz oscillator, a variable impedance circuit connected to the resonance circuit for changing the reactance of the quartz oscillator, a detecting circuit for detecting the output level of the active circuit, and an impedance control circuit for controlling the variable impedance circuit in response to an output level detected by the detecting circuit.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
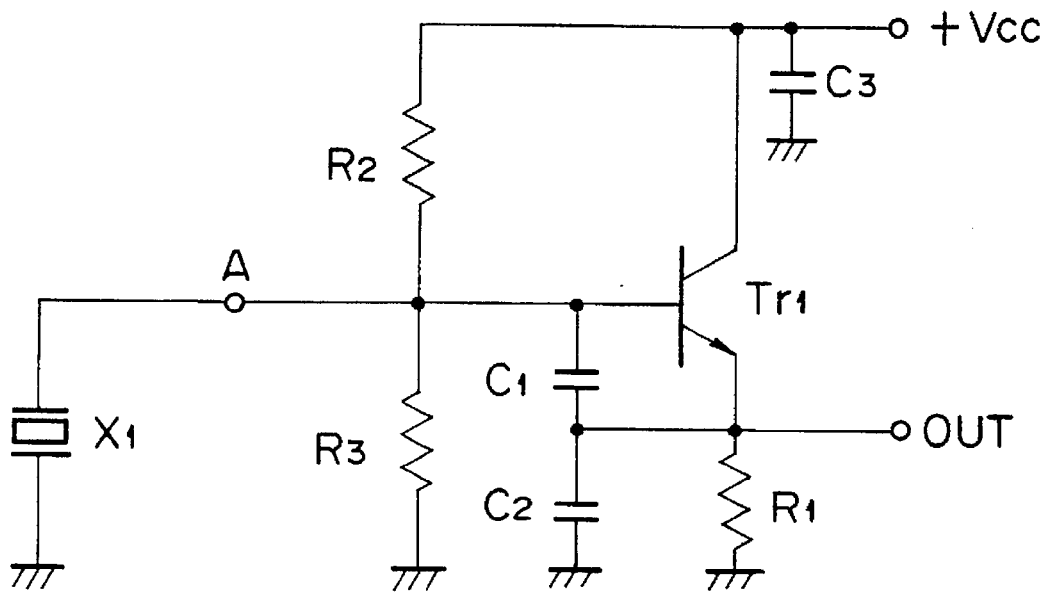
FIG. 1 is a circuit diagram showing a conventional oscillation circuit.
Figure 2:
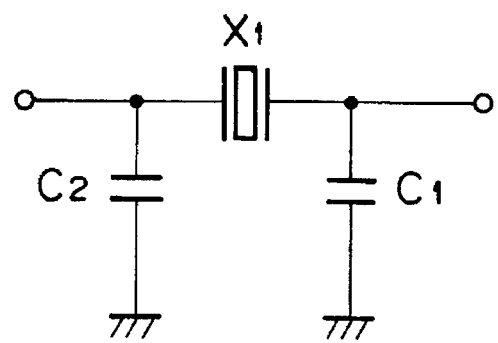
FIG. 2 shows an equivalent circuit representative of a quartz oscillator and capacitors included in the conventional circuit.

To better understand the present invention, a brief reference will be made to a conventional oscillation circuit, shown in FIG. 1. As shown, the oscillation circuit has a quartz oscillator $X_1$, a transistor $Tr_1$, resistors $R_1$, $R_2$ and $R_3$, capacitors $C_1$, $C_2$ and $C_3$, and an output terminal OUT. The resistor $R_1$ sets the operation current of the circuit while the resistors $R_2$ and $R_3$ set the bias voltage of the transistor $Tr_1$. The capacitor $C_3$ is used to connect the collector of the transistor $Tr_1$ to to ground. The capacitors $C_1$ and $C_2$ and quartz oscillator $X_1$ constitute in combination a feedback section, as represented by an equivalent circuit in FIG. 2. The prerequisite with the oscillation circuit is that the oscillator $X_1$ be provided with an inductive reactance characteristic, i.e., oscillatory at a frequency exhibiting an inductive reactance characteristic.

Figure 3:
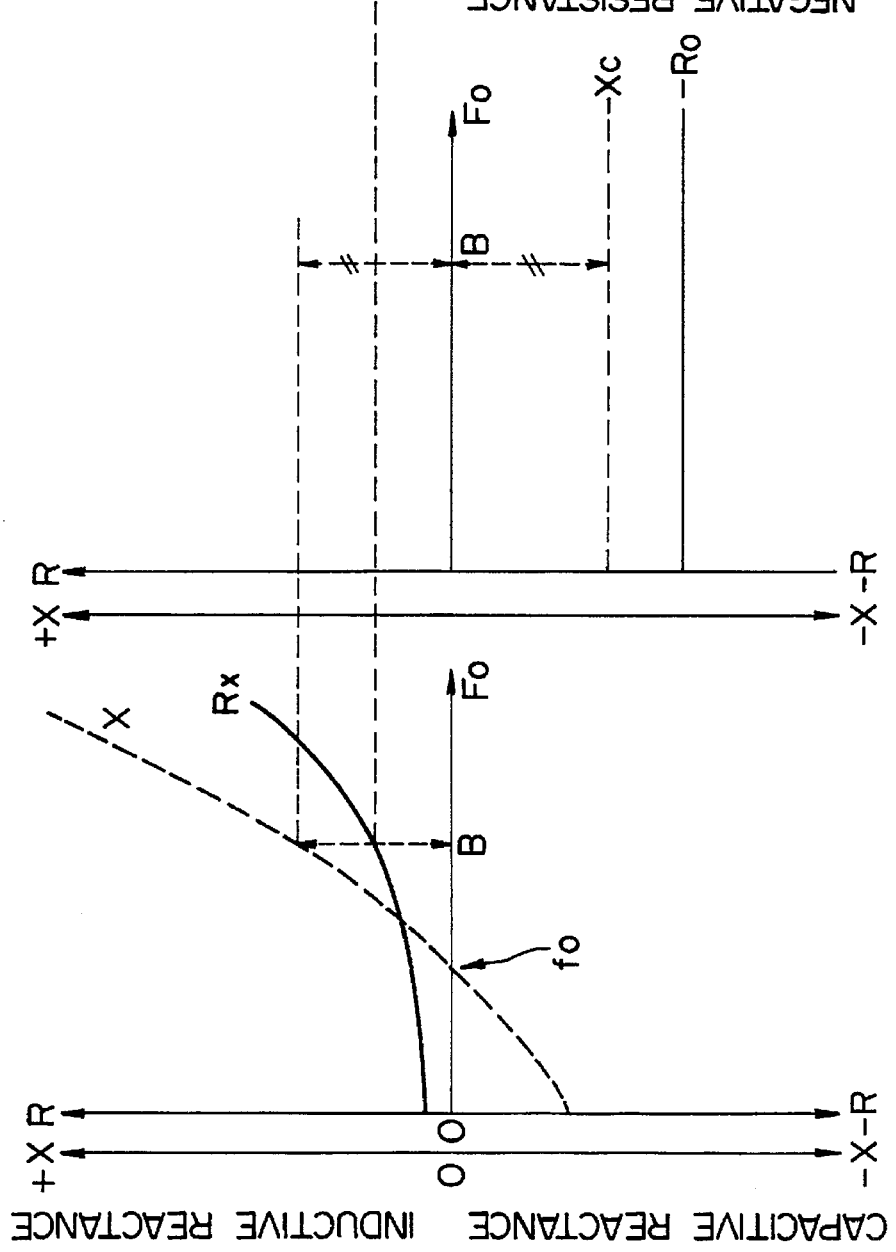
FIG. 3A is a graph indicating the impedance characteristic of the quartz oscillator.
FIG. 3B is a graph showing the impedance characteristic of the conventional oscillation circuit.
FIG. 3C is a graph representative of a relation between the oscillation level and the negative resistance.

Referring to FIGS. 3A–3C, the impedance characteristic of the oscillator $X_1$ and that of the oscillation circuit will be described. The impedance characteristics are each measured at a point A shown in FIG. 1. Specifically, FIG. 3A indicates the impedance characteristic of the oscillator $X_1$. As shown, the resistance Rx of the oicillator $X_1$ tends to increase as the frequency exceeds a resonance frequency Po. On the other hand, as shown in FIG. 3B, the impedance characteristic of the oscillation circuit (negative resistance —Ro and reactance Xc) is determined by the transistor $Tr_1$ and capacitors $C_1$ and $C_2$; generally, the impedance changes little relative to the frequency. FIG. 3C indicates a relation between the oscillation level Po of the oscillation circuit and the negative resistance —Ro. As shown, the negative resistance —Ro tends to decrease with the increase in oscillation level Po.

The precondition for the conventional oscillation circuit to oscillate is as follows. Oscillation begins at a frequency at which the absolute value of both the capacitive reactance Xc of the oscillation circuit and the inductive reactance Xe of the quartz oscillator $X_1$ coincide (point B, FIG. 3A). When the resistance Rx of the oscillator $X_1$ as measured at the above-mentioned frequency is smaller than the absolute value of the negative resistance —Ro of the circuit, the oscillation continues. As the oscillation level increases to one at which |Rx|=|—Ro| holds, the oscillation is stabilized.

Figure 4:
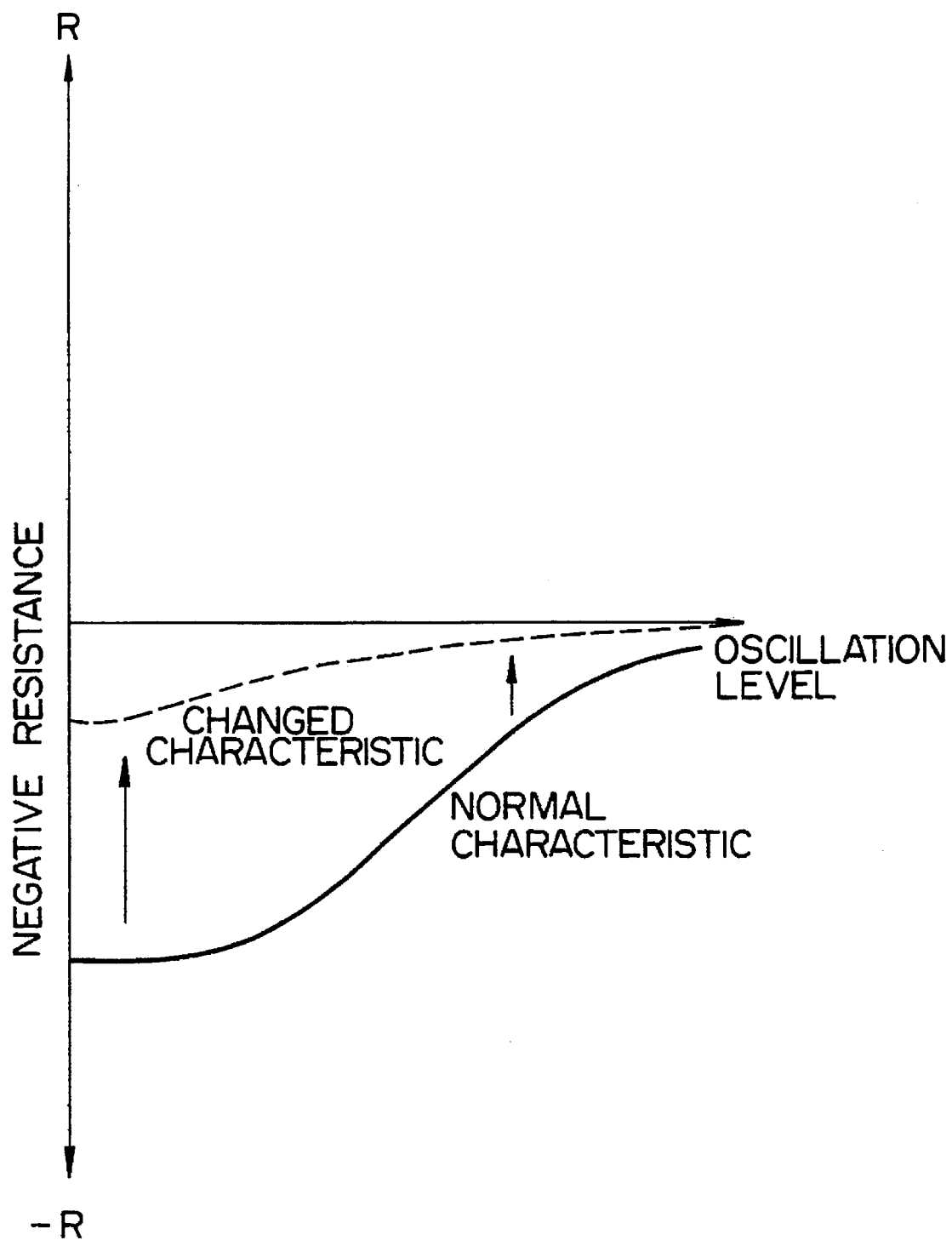
FIG. 4 is a graph indicative of changes in negative resistance.

However, the conventional oscillation circuit has a drawback that, as shown in FIG. 4, the oscillation level falls when the negative resistance of the circuit decreases due to, for example, a change in ambient temperature. Moreover, the circuit practically stops oscillating when the negative resistance thereof decreases to below the resistance of the quartz oscillator $X_1$.

Figure 5:
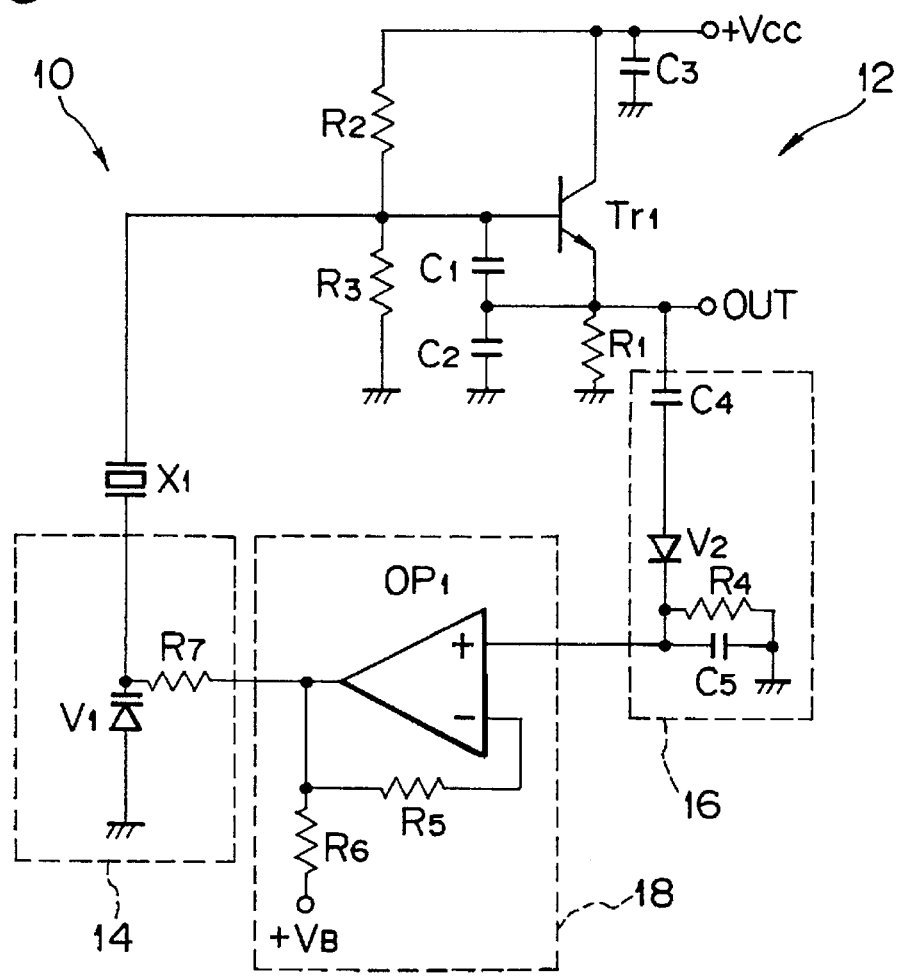
FIG. 5 is a circuit diagram representative of an oscillation circuit embodying the present invention; and FIG: 6 is a graph indicative of a characteristic particular to a varactor diode included in the embodiment.

Referring to FIG. 5, an oscillation circuit embodying the present invention is shown. As shown, the oscillation circuit has a resonance circuit 10 including a quartz oscillator $X_1$, an active circuit 12 for driving the oscillator $X_1$ and having an output terminal OUT, a variable impedance circuit 14 connected to the resonance circuit 10, an output level detecting circuit 16 connected to the output terminal OUT, and an impedance control circuit 18 for controlling the variable impedance circuit 14 in response to a level detected by the detecting circuit 16. Specifically, when the output level falls as detected by the detecting circuit 16, the impedance control circuit 18 so controls the variable impedance circuit 14 as to lower the equivalent resistance of the oscillator $X_1$. The impedance circuit 14 is implemented by a varactor diode connected in series with the oscillator $X_1$, as will be described in detail later. A transistor $Tr_1$, capacitors $C_1$–$C_3$ and resistors $R_1$–$R_3$ also shown in FIG. 5 will not be described specifically since they are identical with the corresponding constituents of the conventional circuit.

Figure 6:
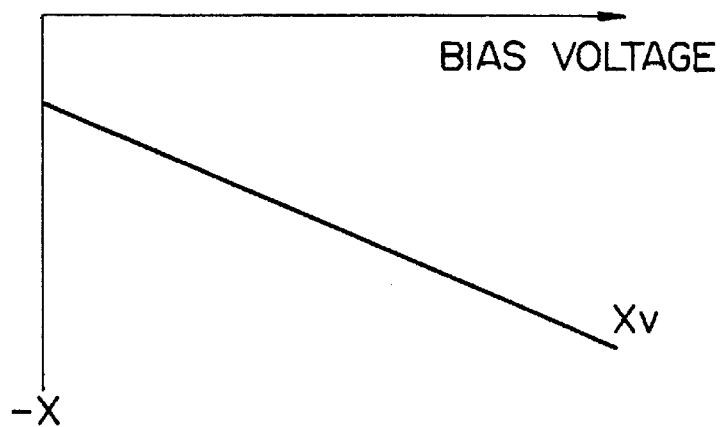

The impedance circuit 14 for causing the reactance X1 of the oscillator $X_1$ to change is made up of a varactor diode $V_1$ and a resistor $R_7$ which feeds a bias voltage. The varactor diode $V_1$ has a capacitive reactance Xv. As shown in FIG. 6, the capacitive reactance Xv of the diode $V_1$ increases with the increase in bias voltage. In this sense, the varactor diode $V_1$ and oscillator $X_1$ cooperate as a resonance circuit for changing the impedance.

The detecting circuit 16 responsive to the output level of the oscillation circuit is made up of a loose coupling capacitor C4, and a capacitor C5, a diode V2, and a resistor R4 which constitute a conventional high frequency detector in combination. The oscillation output signal is loosely coupled by the capacitor C4 and then detected by the detector, i.e., diode V2, resistor R4 and capacitor C5. The signal detected by such a detector is a DC voltage; the voltage is high when the output level is high or low when the output level is low.

The resulting output of the detecting circuit 16 is applied to an operational amplifier OP1 included in the impedance control circuit 18. The impedance control circuit 18 is implemented as a conventional in-phase amplifier having the operational amplifier OP1 and resistors R5 and R6. The control circuit 18 processes the output of the detecting circuit 16 and then delivers the result of processing to the varactor diode V1 via the resistor R7.

Assume that the negative resistance —Ro of the oscillation circuit has decreased due to, for example, a change in ambient temperature, causing the output level of the circuit to fall. Then, the bias voltage of the varactor diode V1 and, therefore, the capacitive reactance Xv of the diode V1 is lowered. As a result, the inductive reactance XI of the oscillator $X_1$ increases to in turn lower the oscillation frequency. This is because the impedance of the oscillation circuit is constant. Further, since the resistance of the resonance circuit 10, i.e., the resistance of the oscillator $X_1$ decreases with the decrease in frequency, the oscillation level is prevented from falling despite the fall of the negative resistance —Ro of the oscillation circuit.

In summary, it will be seen that the present invention provides an oscillation circuit whose oscillation does not fall in level or does not stop without regard to ambient conditions, e.g., temperature.

Various modifications will become possible for those skilled in the art after receiving the teachings of the present disclosure without departing from the scope thereof.

What is claimed is:

1. A level-controlled oscillation circuit comprising:

a resonance circuit including a quartz oscillator;

an active circuit for driving said quartz oscillator;

a continuously variable impedance circuit connected to said resonance circuit for continuously varying a reactance of said quartz oscillator;

a detecting circuit for detecting an output level of said active circuit; and an impedance control circuit for controlling said continuously variable impedance circuit in response to an output level detected by said detecting circuit;

a capacitive reactance of said continuously variable impedance circuit varying proportionally with said detected output level, said impedance control circuit, by continuously varying said capacitive reactance of said continuously variable impedance circuit, controls an output level of said level-controlled oscillation circuit by maintaining an impedance of said resonance circuit constant despite a fall in a negative resistance of said resonance circuit occasioned by changes in ambient conditions.

2. An oscillation circuit as claimed in claim 1, wherein said impedance control circuit controls, when the output level detected by said detecting circuit falls, said continuously variable impedance circuit such that an equivalent resistance of said quartz oscillator decreases.

3. An oscillation circuit as claimed in claim 1, wherein said continuously variable impedance circuit comprises a varactor diode connected in series with said quartz oscillator.

* * * * *